US010483137B2

(12) United States Patent
Masutomi et al.

(10) Patent No.: US 10,483,137 B2
(45) Date of Patent: Nov. 19, 2019

(54) SUBSTRATE LIQUID PROCESSING APPARATUS, SUBSTRATE LIQUID PROCESSING METHOD, AND STORAGE MEDIUM

(71) Applicant: Tokyo Electron Limited, Tokyo (JP)

(72) Inventors: Hiroyuki Masutomi, Kumamoto (JP); Toshiyuki Shiokawa, Kumamoto (JP); Koji Tanaka, Kumamoto (JP); Takami Satoh, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 17 days.

(21) Appl. No.: 15/649,757

(22) Filed: Jul. 14, 2017

(65) Prior Publication Data

US 2018/0025927 A1    Jan. 25, 2018

(30) Foreign Application Priority Data

Jul. 22, 2016 (JP) .................. 2016-144781

(51) Int. Cl.
| | |
|---|---|
| H01L 21/67 | (2006.01) |
| H01L 21/673 | (2006.01) |
| H01L 21/311 | (2006.01) |
| G02F 1/1333 | (2006.01) |
| H01L 21/8234 | (2006.01) |
| G02F 1/13 | (2006.01) |

(52) U.S. Cl.
CPC .... *H01L 21/67253* (2013.01); *H01L 21/6708* (2013.01); *H01L 21/67051* (2013.01); *H01L 21/67086* (2013.01); *H01L 21/67109* (2013.01); *H01L 21/67313* (2013.01); *G02F 1/1303* (2013.01); *G02F 1/1333* (2013.01); *H01L 21/31111* (2013.01); *H01L 21/823431* (2013.01)

(58) Field of Classification Search
CPC ............... G02F 1/1303; G02F 1/1333; H01L 21/31111; H01L 21/67051; H01L 21/6708; H01L 21/67086; H01L 21/67109; H01L 21/67253; H01L 21/67313; H01L 21/823431
USPC ............ 156/345.11, 345.13, 345.16, 345.18, 156/345.24, 345.17; 216/83, 84, 96
See application file for complete search history.

(56) References Cited

U.S. PATENT DOCUMENTS

| | | | | |
|---|---|---|---|---|
| 5,000,795 A | * | 3/1991 | Chung ............... | B08B 3/102 134/102.2 |
| 5,698,040 A | * | 12/1997 | Guldi ............... | H01L 21/67051 134/1.3 |
| 2004/0221880 A1 | * | 11/2004 | Tomita ............... | B08B 3/10 134/95.1 |
| 2015/0197861 A1 | * | 7/2015 | Tice ............... | H01L 21/67086 216/91 |

FOREIGN PATENT DOCUMENTS

JP    2012-015490 A    1/2012

* cited by examiner

*Primary Examiner* — Lan Vinh
(74) *Attorney, Agent, or Firm* — Abelman, Frayne & Schwab

(57) ABSTRACT

The substrate liquid processing apparatus includes a processing bath that accommodates substrates, and a plurality of gas supply pipes provided in a processing bath. Ejection holes of one gas supply pipe and ejection holes of another adjacent gas supply pipe do not overlap each other in a direction parallel to the circuit-formed surfaces of the substrates.

10 Claims, 5 Drawing Sheets

SUBSTRATE LIQUID PROCESSING APPARATUS, SUBSTRATE LIQUID PROCESSING METHOD, AND STORAGE MEDIUM

CROSS-REFERENCE TO RELATED APPLICATIONS

This application is based on and claims priority from Japanese Patent Application No. 2016-144781, filed on Jul. 22, 2016, with the Japan Patent Office, the disclosure of which is incorporated herein in its entirety by reference.

TECHNICAL FIELD

The present disclosure relates to a substrate liquid processing apparatus in which a plurality of substrates in an arrangement state are immersed in a processing liquid and subjected to a liquid processing, a substrate liquid processing method, and a storage medium.

BACKGROUND

When, for example, a semiconductor component or a flat panel display is manufactured, a substrate liquid processing apparatus is used to perform various liquid processings on a substrate such as a semiconductor wafer or a liquid crystal substrate using a processing liquid such as a cleaning liquid or an etching liquid.

For example, in a substrate liquid processing apparatus disclosed in Japanese Patent Laid-Open Publication No. 2012-015490, two processing liquid supply pipes are provided in the bottom portion of a processing bath so that a processing liquid is supplied into the processing bath from the processing liquid supply pipes.

In the substrate liquid processing apparatus, a plurality of substrates are immersed in the processing bath in which the processing liquid is stored in a state in which the substrates are vertically erected and aligned at intervals in a horizontal direction. The processing liquid supply pipes extend in a direction orthogonal to the substrates, and processing liquid ejection holes are provided at a predetermined interval for the substrates. The holes are formed as through holes each having a circular opening. The two processing liquid supply pipes are arranged in a state where the respective openings are inclined diagonally inward and upward so as to be directed toward the central side of the substrates.

In the substrate liquid processing apparatus, the processing liquid is ejected from the ejection holes of the two processing liquid supply pipes toward the centers of the substrates so that a rising flow of the processing liquid flowing along the surfaces of the substrates is formed within the processing bath, and the surfaces of the substrates are subjected to a liquid processing by the rising processing liquid. In this case, the processing liquid supplied from the processing liquid supply pipes into the processing bath is supplied in a state of being heated and boiled in advance. By boiling the processing liquid, bubbles are generated in the processing liquid so as to promote the rising flow of the processing liquid.

SUMMARY

According to an aspect of the present disclosure, a substrate liquid processing apparatus includes: a processing bath configured to accommodate therein a processing liquid including a phosphoric acid aqueous solution and a plurality of substrates arranged in a vertical direction, and process the substrates using the processing liquid; a processing liquid supply pipe configured to supply the processing liquid into the processing bath; and a plurality of gas supply pipes provided in the processing bath and configured to form bubbles by supplying a gas into the processing liquid, wherein the gas supply pipes are provided below the substrates, and extend in a horizontal direction perpendicular to circuit-formed surfaces of the substrates, and each of the gas supply pipes has a plurality of ejection holes opened to one side, and ejection holes of one gas supply pipe and ejection holes of another gas supply pipe adjacent to the one gas supply pipe are arranged in a zigzag manner without overlapping each other, in a direction parallel to the circuit-formed surfaces of the substrates.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
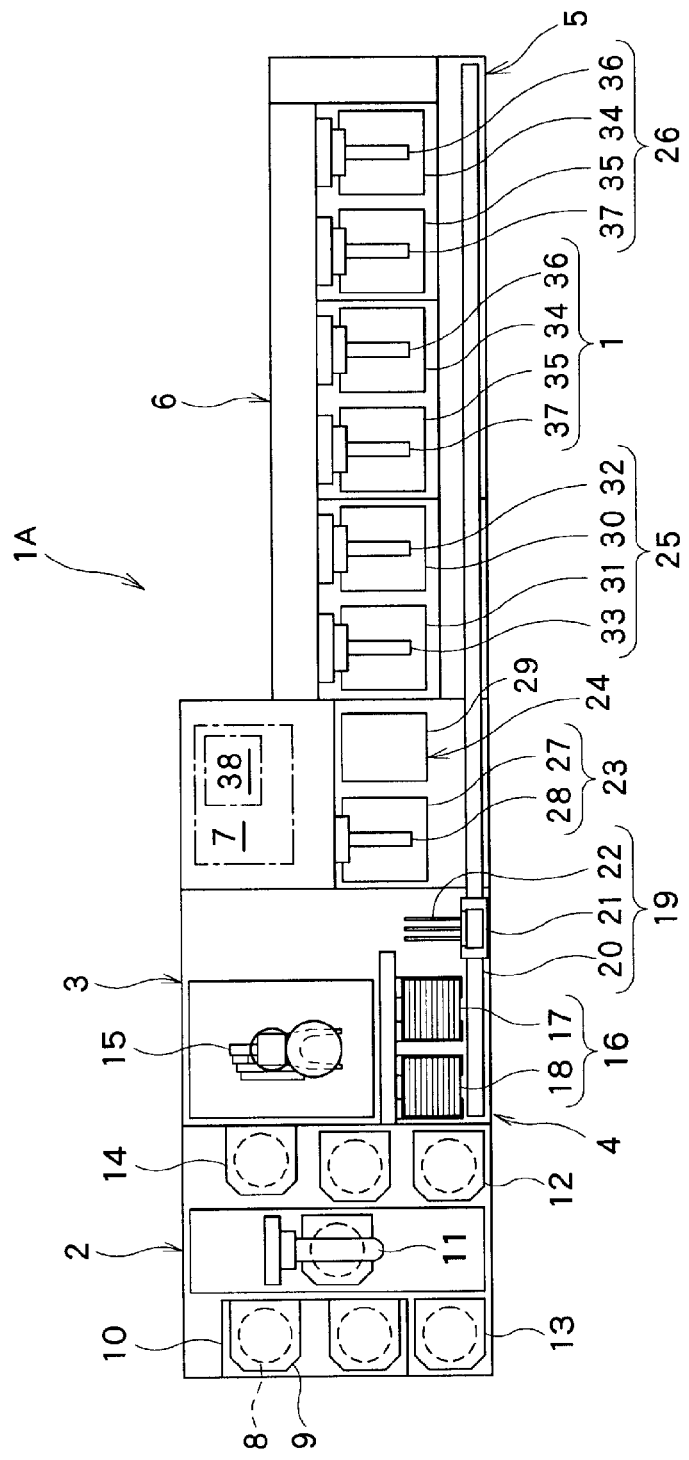
FIG. 1 is a plan explanatory view illustrating a substrate liquid processing system.
Figure 2:
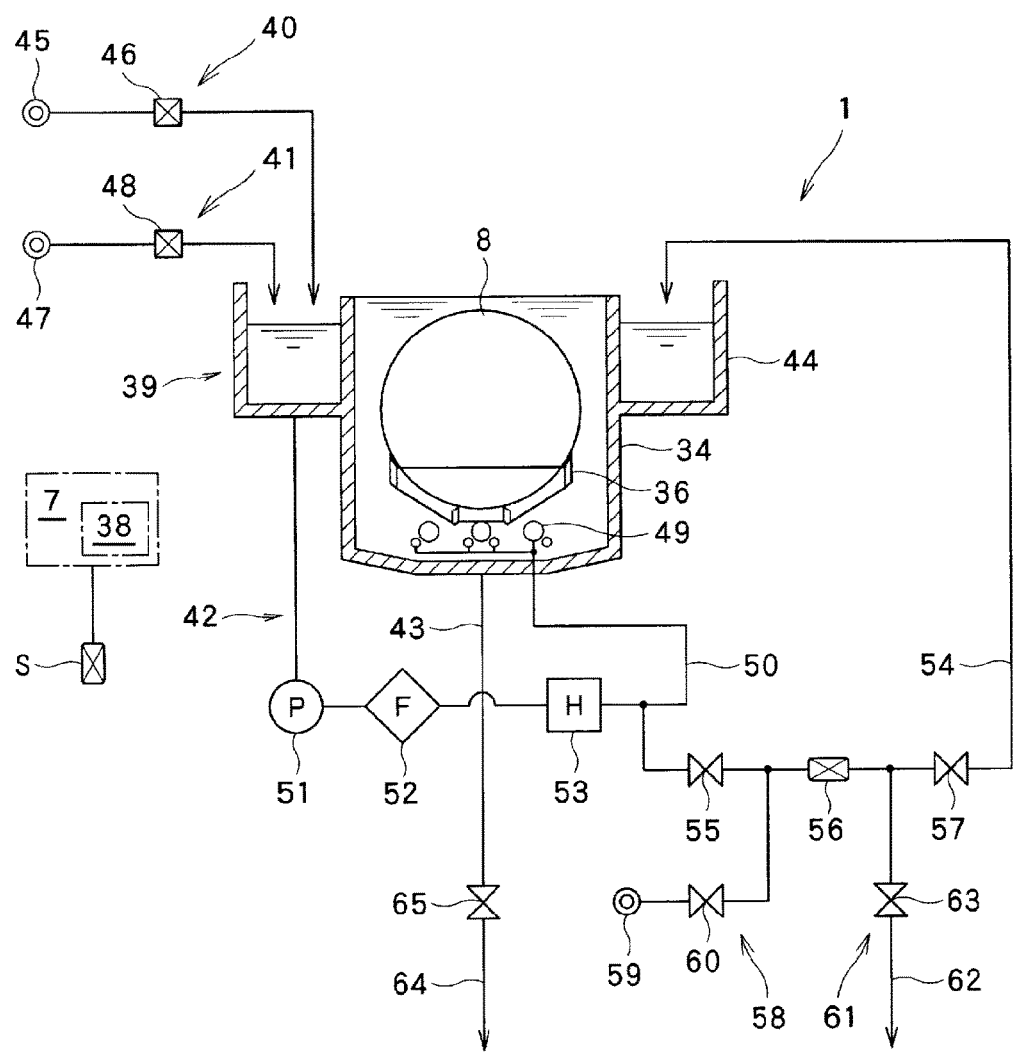
FIG. 2 is a side view illustrating a substrate liquid processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Although the processing liquid is supplied into the processing bath in a boiled state as described above, forming bubbles in the processing liquid by supplying $N_2$ gas into the processing bath is taken into consideration in order to stabilize the boiled state of the processing liquid within the processing bath even when the atmospheric pressure fluctuates.

However, it has been conventionally difficult to generate stable bubbles in the processing liquid within the processing bath. For example, when bubbles become non-uniform, or concentrate, the bubbles coalesce together, which causes variations in bubble diameters, and as a result, it is difficult to perform a uniform liquid processing.

The present disclosure has been made in view of these problems, and provides a substrate liquid processing apparatus, a substrate liquid processing method, and a storage medium, which are capable of forming uniform bubbles in a processing bath so as to perform a liquid processing on substrates.

The present disclosure provides a substrate liquid processing apparatus includes: a processing bath configured to accommodate therein a processing liquid including a phosphoric acid aqueous solution and a plurality of substrates arranged in a vertical direction, and process the substrates using the processing liquid; a processing liquid supply pipe configured to supply the processing liquid into the processing bath; and a plurality of gas supply pipes provided in the processing bath and configured to form bubbles by supplying a gas into the processing liquid, wherein the gas supply pipes are provided below the substrates, and extend in a horizontal direction perpendicular to circuit-formed surfaces of the substrates, and each of the gas supply pipes has a plurality of ejection holes opened to one side, and ejection holes of one gas supply pipe and ejection holes of another gas supply pipe adjacent to the one gas supply pipe are arranged in a zigzag manner without overlapping each other, in a direction parallel to the circuit-formed surfaces of the substrates.

In the substrate liquid processing apparatus described above, the plurality of substrates are arranged at a predetermined arrangement pitch, and the ejection holes of the gas supply pipes are formed at an arrangement pitch corresponding to n times (n is an integer of 2 or more) the arrangement pitch of the substrates.

In the substrate liquid processing apparatus described above, the ejection holes of the gas supply pipes are arranged at intermediate positions between the respective substrates.

In the substrate liquid processing apparatus described above, a flow direction of a gas flowing through one gas supply pipe is directed opposite to a flow direction of a gas flowing through another adjacent gas supply pipe.

In the substrate liquid processing apparatus described above, flow rates of one gas supply pipe and another adjacent gas supply pipe are adjusted independently of each other.

In the substrate liquid processing apparatus described above, the one gas supply pipe and another adjacent gas supply pipe are divided into a plurality of regions from an upstream side to a downstream side, and a flow rate of each of the regions is independently adjusted.

Another aspect of the present disclosure provides a substrate liquid processing method performed using a substrate liquid processing apparatus that includes: a processing bath configured to accommodate therein a processing liquid including a phosphoric acid aqueous solution and a plurality of substrates arranged in a vertical direction, and process the substrates using the processing liquid; a processing liquid supply pipe configured to supply the processing liquid into the processing bath; and a plurality of gas supply pipes provided in the processing bath and configured to form bubbles by supplying a gas into the processing liquid, wherein the gas supply pipes are provided below the substrates, and extend in a horizontal direction perpendicular to circuit-formed surfaces of the substrates, and each of the gas supply pipes has a plurality of ejection holes opened to one side, and ejection holes of one gas supply pipe and ejection holes of another gas supply pipe adjacent to the one gas supply pipe are arranged in a zigzag manner without overlapping each other, in a direction parallel to the circuit-formed surfaces of the substrates. The substrate liquid processing method includes: supplying the gas into the processing liquid through the ejection holes from the one gas supply pipe and the other adjacent gas supply pipe; and forming bubbles rising between the substrates in the processing liquid.

Another aspect of the present disclosure provides a non-transitory computer-readable storage medium storing a computer-executable program that, when executed, causes a computer to execute a substrate liquid processing method using a substrate liquid processing apparatus that includes: a processing bath configured to accommodate therein a processing liquid including a phosphoric acid aqueous solution and a plurality of substrates arranged in a vertical direction, and process the substrates using the processing liquid; a processing liquid supply pipe configured to supply the processing liquid into the processing bath; and a plurality of gas supply pipes provided in the processing bath and configured to form bubbles by supplying a gas into the processing liquid, wherein the gas supply pipes are provided below the substrates, and extend in a horizontal direction perpendicular to circuit-formed surfaces of the substrates, and each of the gas supply pipes has a plurality of ejection holes opened to one side, and ejection holes of one gas supply pipe and ejection holes of another gas supply pipe adjacent to the one gas supply pipe are arranged in a zigzag manner without overlapping each other, in a direction parallel to the circuit-formed surfaces of the substrates. The substrate liquid processing method comprises: supplying the gas into the processing liquid through the ejection holes from the one gas supply pipe and the other adjacent gas supply pipe; and forming bubbles rising between the substrates in the processing liquid.

According to the present disclosure, it is possible to perform a liquid processing by uniformly forming bubbles in a processing liquid within a processing bath.

Hereinafter, an exemplary embodiment of the present disclosure will be described with reference to FIGS. 1 to 5. First, an entire substrate liquid processing system 1A in which a substrate liquid processing apparatus 1 according to the present disclosure is incorporated will be described.

As illustrated in FIG. 1, the substrate liquid processing system 1A includes a carrier carry-in/out section 2, a lot forming section 3, a lot placing section 4, a lot conveyance section 5, a lot processing section 6, and a controller 7.

Among these, the carrier carry-in/out section 2 performs carrying-in/out of carriers 9 in each of which a plurality of (e.g., 25) substrates (silicon wafers) 8 are accommodated in a state where the substrates are vertically arranged side by side in a horizontal posture.

The carrier carry-in/out section 2 includes a carrier stage 10 on which a plurality of carriers 9 are placed, a carrier conveyance mechanism 11 configured to convey the carriers 9, carrier stocks 12 and 13 that temporarily store the carriers 9, and a carrier placing table 14 on which the carriers 9 are placed. Here, the carrier stock 12 temporarily stores substrates 8 to become products before the substrates 8 are processed in the lot processing section 6. The carrier stock 13 temporarily stores substrates 8 to become products after the substrates 8 are processed in the lot processing section 6.

Then, the carrier carry-in/out section 2 conveys the carrier 9 carried into the carrier stage 10 from the outside, to the carrier stock 12 or the carrier placing table 14 using the carrier conveyance mechanism 11. The carrier carry-in/out section 2 conveys the carrier 9 placed on the carrier placing table 14 to the carrier stock 13 or the carrier stage 10 using the carrier conveyance mechanism 11. The carrier 9 conveyed into the carrier stage 10 is carried out to the outside.

The lot forming section 3 forms a lot including a plurality of substrates 8 (for example, 50 sheets) to be simultaneously processed by combining the substrates 8 accommodated in one or more carriers 9. When the lot is formed, the lot may be formed in such a manner that pattern-formed surfaces of the substrates 8 faces each other, or all pattern-formed surfaces of the substrates 8 are directed to one side.

The lot forming section 3 is provided with a substrate conveyance mechanism 15 configured to convey the plurality of substrates 8. The substrate conveyance mechanism 15 may change the posture of the substrates 8 from a horizontal posture to a vertical posture, and from a vertical posture to a horizontal posture during the conveyance of the substrates 8.

Then, the lot forming section 3 conveys the substrates 8 from the carrier 9 placed on the carrier placing table 14 to the lot placing section 4 using the substrate conveyance mechanism 15, and places the substrates 8 forming the lot in the lot placing section 4. The lot forming section 3 conveys the lot placed in the lot placing section 4 to the carrier 9 placed on the carrier placing table 14 by the substrate conveyance mechanism 15. The substrate conveyance mechanism 15 includes, as a substrate support configured to support the plurality of substrates 8, two types of substrate supports, that is, an unprocessed substrate support that supports unprocessed substrates 8 (before the substrates 8 are conveyed by the lot conveyance section 5), and a processed substrate support that supports processed substrates 8 (after the substrates 8 are conveyed by the lot conveyance section 5). Accordingly, for example, particles adhering to, for example, the unprocessed substrates 8 may be suppressed from sticking to, for example, the processed substrates 8.

In the lot placing section 4, the lots conveyed between the lot forming section 3 and the lot processing section 6 by the lot conveyance section 5 are temporarily placed (on standby) on a lot placing table 16.

The lot placing section 4 is provided with a carry-in side lot placing table 17 on which an unprocessed lot is placed (before the lot is conveyed by the lot conveyance section 5), and a carry-out side lot placing table 18 on which a processed lot is placed (after the lot is conveyed by the lot conveyance section 5). In each of the carry-in side lot placing table 17 and the carry-out side lot placing table 18, a plurality of substrates 8 for one lot are placed in the state where the substrates 8 are aligned in the front-rear direction in a vertical posture.

In the lot placing section 4, the lot formed by the lot forming section 3 is placed on the carry-in side lot placing table 17, and is carried into the lot processing section 6 through the lot conveyance section 5. In the lot placing section 4, the lot carried out of the lot processing section 6 through the lot conveyance section 5 is placed on the carry-out side lot placing table 18, and is conveyed to the lot forming section 3.

The lot conveyance section 5 conveys lots between the lot placing section 4 and the lot processing section 6 or within the lot processing section 6.

The lot conveyance section 5 is provided with a lot conveyance mechanism 19 configured to convey lots. The lot conveyance mechanism 19 is constituted with a rail 20 arranged along the lot placing section 4 and the lot processing section 6, and a moving body 21 which move along the rail 20 while holding a plurality of substrates 8. The moving body 21 is provided with a to substrate holder 22 to be movable back and forth. The substrate holder 22 hold a plurality of substrates 8 in the state where the substrates 8 are aligned in a front-rear direction in a vertical posture.

The lot conveyance section 5 receives a lot placed on the carry-in side lot placing table 17 by the substrate holder 22 of the lot conveyance mechanism 19, and delivers the received lot to the lot processing section 6. The lot conveyance section 5 receives a lot processed in the lot processing section 6 by the substrate holder 22 of the lot conveyance mechanism 19, and delivers the lot to the carry-out side lot placing table 18. The lot conveyance section 5 conveys a lot within the lot processing section 6 using the lot conveyance mechanism 19.

The lot processing section 6 performs processings such as, for example, etching, cleaning, or drying, on one lot constituted by the plurality of substrates 8 aligned in the vertical posture in the front-rear direction.

In the lot processing section 6, a drying device 23 configured to dry the substrates 8, a substrate holder cleaning device 24 configured to clean the substrate holder 22, a cleaning device 25 configured to clean the substrates 8, and two etching devices (substrate liquid processing apparatuses) according to the present disclosure, which are configured to etch the substrates 8, are provided side by side.

In the drying device 23, a substrate lift mechanism 28 is provided in a processing bath 27 to be movable up and down. A drying processing gas (e.g., isopropyl alcohol (IPA)) is supplied to the processing bath 27. In the substrate lift mechanism 28, a plurality of substrates 8 for one lot are held in the state of being aligned in the front-rear direction in the vertical posture. The drying device 23 receives a lot from the substrate holder 22 of the lot conveyance mechanism 19 by the substrate lift mechanism 28, and moves up and down the lot by the substrate lift mechanism 28 so that the substrates 8 are dried by the drying processing gas supplied to the processing bath 27. The drying device 23 delivers the lot from the substrate lift mechanism 28 to the substrate holder 22 of the lot conveyance mechanism 19.

The substrate holder cleaning device 24 is configured to supply a cleaning processing liquid and a drying gas to the processing bath 29. The substrate holder cleaning device 24 supplies the cleaning processing liquid to the substrate holder 22 of the lot conveyance mechanism 19, and supplies the drying gas to the substrate holder 22 so as to clean the substrate holder 22.

The cleaning device 25 includes a cleaning processing bath 30 and a rinse processing bath 31, and substrate lift mechanisms 32 and 33 are respectively provided in the processing baths 30 and 31 to be movable up and down. A cleaning processing liquid (e.g., SC-1) is stored in the cleaning processing bath 30. A rinse processing liquid (e.g., pure water) is stored in the rinse processing bath 31.

The etching device 1 (26) includes a processing bath 34 for etching and a processing bath 35 for rinsing, and substrate lift mechanisms 36 and 37 are provided in the processing baths 34 and 35, respectively, so as to be able to move up and down. An etching processing liquid (a phosphoric acid aqueous solution) is stored in the processing bath 34 for etching. A rinse processing liquid (e.g., pure water) is stored in the processing bath 35 for rinsing. As described above, the etching device 1 constitutes the substrate liquid processing apparatus according to the present disclosure.

The cleaning device 25 and the etching device 1 (26) have the same configuration. Hereinafter, the etching device (the substrate liquid processing apparatus) 1 will be described. In the substrate lift mechanism 36, a plurality of substrates 8 for one lot are held in the state of being aligned in the front-rear direction in the vertical posture with a predetermined arrangement pitch P (see, e.g., FIG. 4B). In the etching device 1, the lot is received from the substrate holder 22 of the lot conveyance mechanism 19 by the substrate lift mechanism 36, and is moved up and down by the substrate lift mechanism 36 so that the lot is immersed in the etching processing liquid of the processing bath 34 so as to etch the substrates 8. Then, the etching device 1 delivers the lot from the substrate lift mechanism 36 to the substrate holder 22 of the lot conveyance mechanism 19. In the etching device 1, the lot is received by the substrate lift mechanism 37 from the substrate holder 22 of the lot conveyance mechanism 19, and is moved up and down by the substrate lift mechanism 37 so that the lot is immersed in the rinse processing liquid of the processing bath 35 so as to rinse the substrates 8. Thereafter, the etching device 1 delivers the lot from the substrate lift mechanism 37 to the substrate holder 22 of the lot conveyance mechanism 19.

The controller 7 controls the operations of respective units of the substrate liquid processing system 1A (for example, the carrier carry-in/out section 2, the lot forming section 3, the lot placing section 4, the lot conveyance section 5, and the lot processing section 6).

The controller 7 is, for example, a computer, and includes a computer readable storage medium 38. A program that controls various processings to be executed in the substrate liquid processing apparatus 1 is stored in the storage medium 38. The controller 7 reads and executes the program stored in the storage medium 38 so as to control the operations of the substrate liquid processing apparatus 1. The program may be recorded in the computer readable storage medium 38, and may be installed from another storage medium to the storage medium 38 of the controller 7. The computer readable storage medium 38 may be, for example, a hard disk (HD), a flexible disk (FD), a compact disk (CD), a magneto optical disk (MO), or a memory card.

As described above, in the processing bath 34 of the etching device 1, an aqueous solution of a chemical agent (phosphoric acid) at a predetermined concentration is used as a processing liquid (an etching liquid) in order to perform a liquid processing (an etching processing) on the substrates 8.

As illustrated in FIG. 2 to FIGS. 4A and 4B, the etching device (the substrate liquid processing apparatus) 1 includes: a liquid processing unit 39 configured to store a processing liquid containing a phosphoric acid aqueous solution at a predetermined concentration and process the substrates 8; a phosphoric acid aqueous solution supply unit 40 configured to supply the processing liquid to the liquid processing unit 39; a pure water supply unit 41 configured to supply pure water with which the processing liquid is diluted; a processing liquid circulating line 42 configured to circulate the processing liquid stored in the liquid processing unit 39; and a processing liquid discharge unit 43 configured to discharge the processing liquid from the liquid processing unit 39.

Among these, the liquid processing unit 39 includes the processing bath 34 for etching, whose top side is opened, and an outer bath 44 provided around the upper portion of the processing bath 34 and having a top opening. The processing liquid is stored in the processing bath 34 and the outer bath 44. The processing bath 34 stores the processing liquid in which the substrates 8 are immersed by the substrate lift mechanism 36 in order to perform a liquid processing on the substrates 8. The outer bath 44 stores the processing liquid overflowing from the processing bath 34, and supplies the processing liquid to the processing bath 34 via the processing liquid circulating line 42. In the substrate lift mechanism 36, the plurality of substrates 8 are held in the state of being vertically erected and aligned at intervals in a horizontal direction.

The phosphoric acid aqueous solution supply unit 40 supplies an aqueous solution of a chemical agent (phosphoric acid) having a concentration lower than the processing liquid, to the liquid processing unit 39. The phosphoric acid aqueous solution supply unit 40 includes an aqueous solution supply source 45 that supplies a phosphoric acid aqueous solution at a predetermined concentration and a predetermined temperature. The aqueous solution supply source 45 is connected to the outer bath 44 of the liquid processing unit 39 via a flow rate regulator 46. The flow rate regulator 46 is connected to the controller 7 such that the opening/closing and the flow rate of the flow rate regulator 46 are controlled by the controller 7.

The pure water supply unit 41 supplies pure water in order to replenish moisture evaporated by heating (boiling) the processing liquid. The pure water supply unit 41 includes a pure water supply source 47 that supplies pure water at a predetermined temperature. The pure water supply source 47 is connected to the outer bath 44 of the liquid processing unit 39 via a flow rate regulator 48. The flow rate regulator 48 is connected to the controller 7 such that the opening/closing and the flow rate of the flow rate regulator 48 are controlled by the controller 7.

The processing liquid circulating line 42 includes three processing liquid supply nozzles 49 (processing liquid supply pipes) disposed below the substrates 8 held by the substrate lift mechanism 36 within the processing bath 34, and a circulation flow path 50 formed between the bottom portion of the outer bath 44 of the liquid processing unit 39 and the processing liquid supply nozzles 49. In the circulation flow path 50, a supply pump 51, a filter 52, and a heater 53 are sequentially provided. The supply pump 51 and the heater 53 are connected to the controller 7 such that the driving of the supply pump 51 and the heater 53 is controlled by the controller 7. The processing liquid circulating line 42 circulates the processing liquid from the outer bath 44 to the processing bath 34 by driving the supply pump 51. Here, the processing liquid is heated to a predetermined temperature by the heater 53. The processing liquid circulating line 42 including the supply pump 51, the filter 52, and the heater 53, and the processing liquid supply nozzles 49 serve as a processing liquid supply unit that supplies the processing liquid to the liquid processing unit 39.

Figure 3:
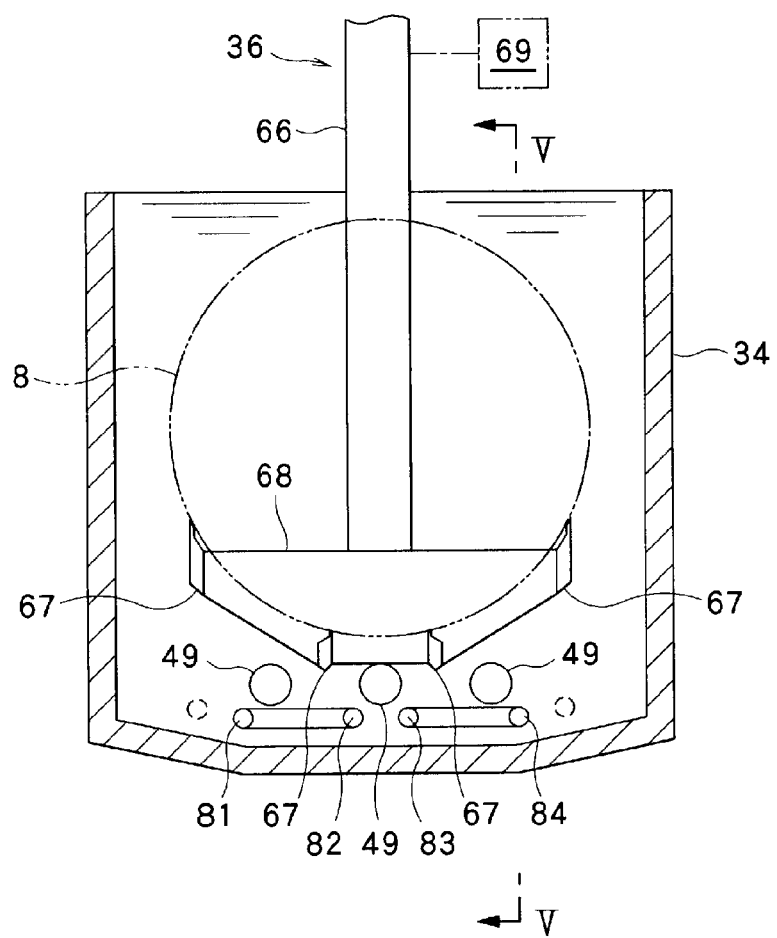
FIG. 3 is a front view illustrating a processing bath.
Figure 4A:
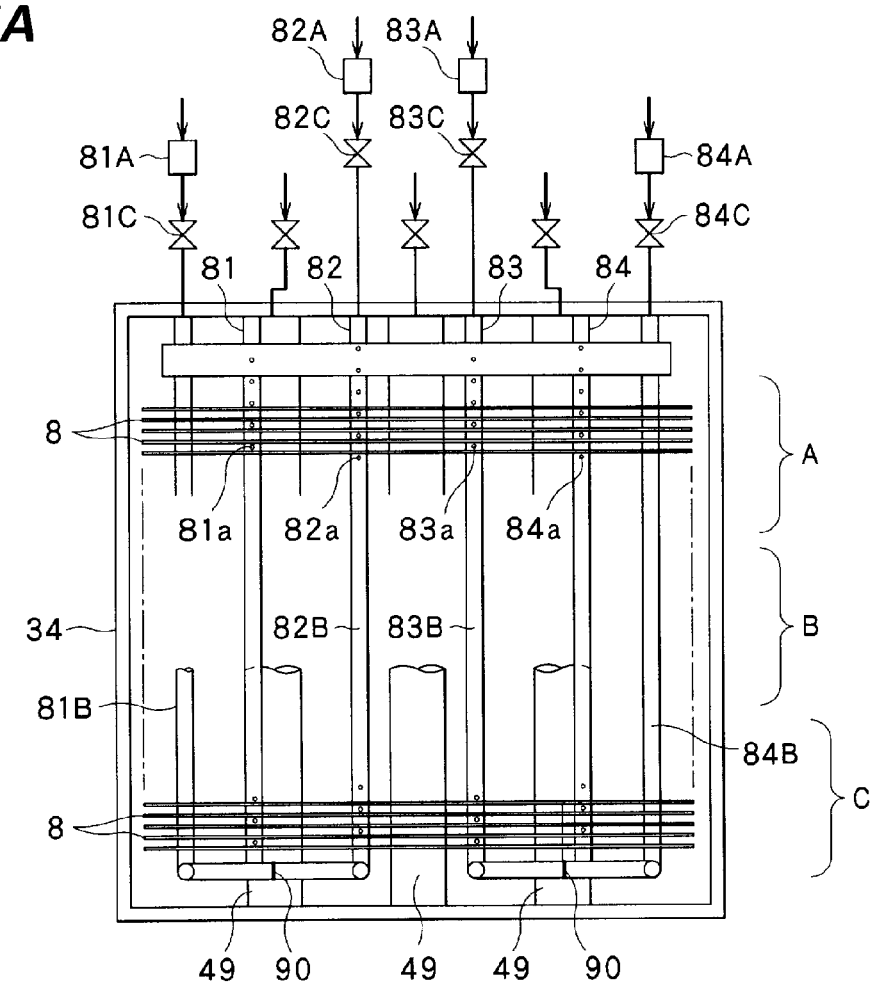
FIG. 4A is a plan view illustrating the processing bath.
Figure 4B:
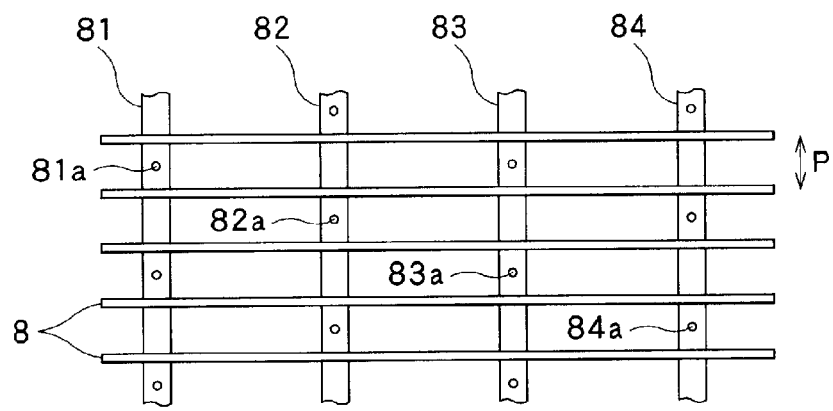
FIG. 4B is an enlarged view of a portion of FIG. 4A.
Figure 5:
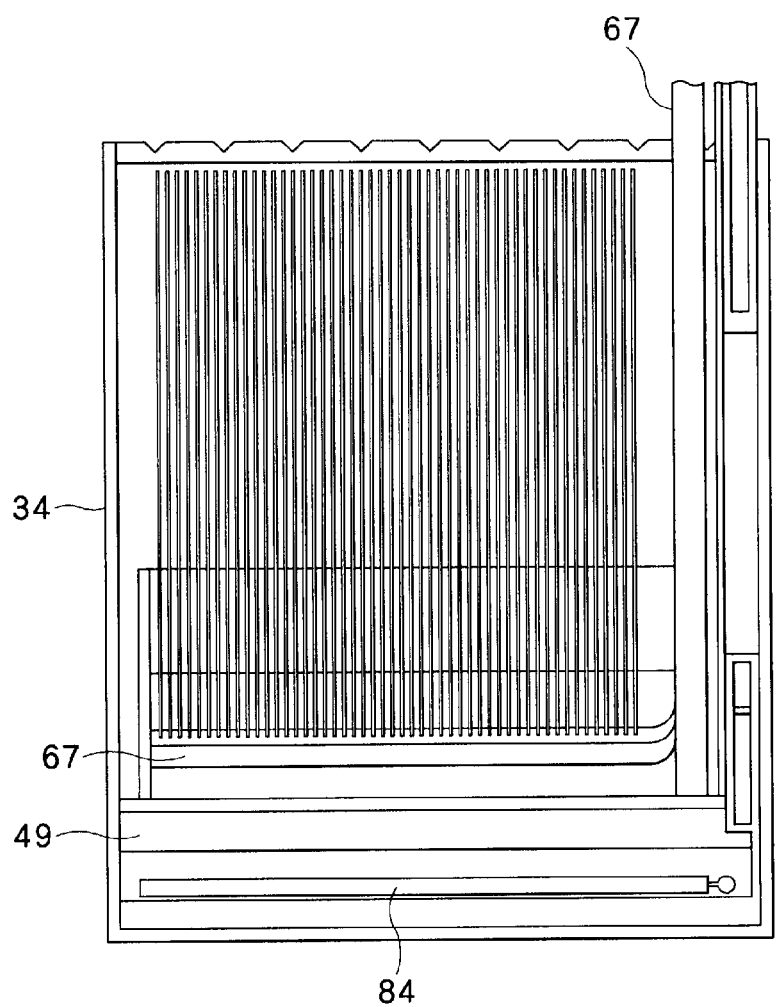
FIG. 5 is a sectional view taken along line V-V in FIG. 3.

As illustrated in FIG. 3 and FIGS. 4A and 4B, the processing liquid supply nozzles 49 are disposed in a direction perpendicular to the plurality of substrates 8 below the substrates 8, and eject the processing liquid toward the substrates 8 held by the substrate lift mechanism 36 from the openings at one side (e.g., the upper side) of the processing liquid supply nozzles 49.

The processing liquid circulating line 42 is connected to a concentration measuring flow path 54 formed between the downstream side of the heater 53 and the outer bath 44. An upstream side opening/closing valve 55, a concentration sensor 56 (a concentration measuring unit), and a downstream side opening/closing valve 57 are sequentially provided in the concentration measuring flow path 54. A cleaning fluid supply unit 58 configured to supply a cleaning fluid (here, pure water at room temperature) used for cleaning the concentration sensor 56 is connected between the upstream side opening/closing valve 55 and the concentration sensor 56. The cleaning fluid supply unit 58 includes a cleaning fluid supply source 59 that supplies the cleaning fluid, and the cleaning fluid supply source 59 is connected between the upstream side opening/closing valve 55 and the concentration sensor 56 via a supply opening/closing valve 60. A cleaning fluid discharge unit 61 configured to discharge the cleaning fluid is connected between the concentration sensor 56 and the downstream side opening/closing valve 57. The cleaning fluid discharge unit 61 includes a discharge flow path 62 connected between the concentration sensor 56 and the downstream side opening/closing valve 57 and communicating with an external exhaust pipe, and a discharge opening/closing valve 63 is provided in the discharge flow path 62. The upstream side opening/closing valve 55, the downstream side opening/closing valve 57, the supply opening/closing valve 60, and the discharge opening/ closing valve 63 are connected to the controller 7 such that the opening/closing of the valves is controlled by the controller 7. The concentration sensor 56 is connected to the controller 7 so as to measure the concentration of the processing liquid flowing through the concentration measuring flow path 54 according to an instruction from the controller 7 and notify the controller 7 of the measured concentration. The cleaning fluid discharge unit 61 mainly discharges the cleaning fluid, but also discharges the processing liquid staying in the concentration measuring flow path 54.

The processing liquid discharge unit 43 includes a drainage flow path 64 connected to the bottom portion of the processing bath 34 of the liquid processing unit 39 and communicating with an external drainage pipe, and an opening/closing valve 65 is provided in the drainage flow path 64. The opening/closing valve 65 is connected to the controller 7 such that the opening/closing thereof is controlled by the controller 7.

In the etching device 1, the plurality of substrates 8 in an arranged state are immersed in the processing liquid stored in the processing bath 34 by the substrate lift mechanism 36. The processing liquid is supplied to the bottom portion of the processing bath 34 from the processing liquid supply nozzles 49 (below the substrates 8), and rises along the surfaces of the substrates 8. Accordingly, in the etching device 1, a liquid processing is performed on the surfaces of the substrates 8 with the processing liquid.

As described above, within the processing bath 34 of the liquid processing unit 39, three processing liquid supply nozzles 49 are disposed below the plurality of substrates 8 to be orthogonal to the plurality of substrates 8, and arranged on the same horizontal plane.

In the processing bath 34, further below the three processing liquid supply nozzles 49, four gas supply pipes 81, 82, 83, and 84 are provided in the horizontal direction perpendicular to the plurality of substrates 8. The gas supply pipes 81, 82, 83, and 84 fall within the range of the length of the substrates 8 in the width direction.

The gas supply pipes 81, 82, 83, and 84 include a plurality of ejection holes 81a, 82a, 83a, and 84a opened upward, respectively, and supply an inert gas such as, for example $N_2$ gas, into the processing liquid within the processing bath 34 so as to form bubbles in the processing liquid. The bubbles composed of $N_2$ gas in the processing liquid form a rising flow in the processing liquid together with moisture vapor in the boiling processing liquid, thereby promoting the liquid processing by the processing liquid.

Among the above described gas supply pipes 81, 82, 83, and 84, the gas supply pipes 81 and 84 at both sides are connected to one end sides of communication pipes 81B and 84B, and flow rate regulating devices 81A and 84A are connected to the other end sides of the communication pipes 81B and 84B (the upper end sides in FIG. 4A) via opening/closing valves 81C and 84C.

The flow rate regulating devices 81A and 84A adjust the flow rate of $N_2$ gas sent from a gas supply source (not illustrated) while supplying the $N_2$ gas to the gas supply pipes 81 and 84 via the communication pipes 81B and 84B. The $N_2$ gas is supplied into the processing liquid from the ejection holes 81a and 84a of the gas supply pipes 81 and 84 so as to form bubbles of the $N_2$ gas.

One end sides of the gas supply pipes 82 and 83 at the central side extend to one end sides of the gas supply pipes 81 and 84, respectively. Meanwhile, one end sides of the gas supply pipes 82 and 83 are provided with closing plates 90, respectively, and do not communicate with one end sides of the gas supply pipes 81 and 84. Thus, the gas supply pipes 81, 82, 83, and 84 may adjust flow rates of gas independently of each other.

Flow rate regulating devices 82A and 83A are connected to the other end sides of the gas supply pipes 82 and 83 (the upper end sides in FIG. 4A) via opening/closing valves 82C and 83C.

The flow rate regulating devices 82A and 83A adjust the flow rate of $N_2$ gas sent from a gas supply source (not illustrated) while supplying the $N_2$ gas to the gas supply pipes 82 and 83. The $N_2$ gas is supplied into the processing liquid from the ejection holes 82a and 83a of the gas supply pipes 82 and 83 so as to form bubbles of the $N_2$ gas.

As described above, the flow rates of the $N_2$ gas flowing through the gas supply pipes 81, 82, 83, and 84 are independently adjusted by the corresponding flow rate regulating devices 81A, 82A, 83A, and 84A, respectively. The $N_2$ gas flowing through the gas supply pipes 81 and 84 at both sides among the gas supply pipes 81, 82, 83, and 84 flows from the lower side to the upper side in FIG. 4A, and the $N_2$ gas flowing through the gas supply pipes 82 and 83 at the central side flows from the upper side to the lower side in FIG. 4A in a direction opposite to the $N_2$ gas within the gas supply pipes 81 and 84. In general, the pressure of the $N_2$ gas flowing through the gas supply pipes 81, 82, 83, and 84 is reduced from the upstream side to the downstream side. Thus, the pressure of the $N_2$ gas supplied into the processing liquid from the ejection holes 81a, 82a, 83a, and 84a at the upstream sides of the gas supply pipes 81, 82, 83, and 84 is higher than that of the $N_2$ gas supplied into the processing liquid from the ejection holes 81a, 82a, 83a, and 84a at the downstream sides.

In the present exemplary embodiment, since the flow direction of $N_2$ gas within the gas supply pipes 81 and 84 at both sides and the flow direction of $N_2$ gas within the gas supply pipes 82 and 83 at the central side are opposite to each other, $N_2$ gas having a high pressure (a high flow rate) is supplied from the gas supply pipes 82 and 83 at the central side to the substrates 8 located at the upper side in FIG. 4A, and $N_2$ gas having a low pressure (a low flow rate) is supplied from the gas supply pipes 81 and 84 at both sides. In FIG. 4A, to the substrates 8 located at the lower side, $N_2$ gas having a low pressure (a low flow rate) is supplied from the gas supply pipes 82 and 83 at the central side, and $N_2$ gas having a high pressure (a high flow rate) is supplied from the gas supply pipes 81 and 84 at both sides.

Therefore, $N_2$ gas having a uniform pressure and a uniform flow rate may be supplied to all substrates 8 regardless of an arrangement position.

As illustrated in FIG. 4B, the plurality of substrates 8 are arranged at a predetermined arrangement pitch P within the processing bath 34, and the ejection holes 81a, 82a, 83a, and 84a of the gas supply pipes 81, 82, 83, and 84 are provided at an arrangement pitch that is twice the arrangement pitch P of the substrates 8, that is, at an arrangement pitch of 2P. Among these, the ejection holes 81a and 83a of the gas supply pipes 81 and 83 overlap each other in a direction parallel to the substrates 8, that is, in a direction parallel to circuit-formed surfaces of the substrates 8, and the ejection holes 82a and 84a of the gas supply pipes 82 and 84 overlap each other in a direction parallel to the substrates 8.

Meanwhile, the ejection holes 81a of the gas supply pipe 81 do not overlap the ejection holes 82a of the gas supply pipe 82 in a direction parallel to the substrates 8, that is, in a direction parallel to circuit-formed surfaces of the substrates 8, and the ejection holes 83a of the gas supply pipe 83 do not overlap the ejection holes 84a of the gas supply pipe 84 in a direction parallel to the substrates 8.

Thus, the ejection holes 81a of one gas supply pipe (for example, the gas supply pipe 81) do not overlap the ejection holes 82a of the gas supply pipe 82 adjacent to the gas supply pipe 81 in the direction parallel to the substrates 8, and the ejection holes 81a of the gas supply pipe 81 and the ejection holes 82a of the other gas supply pipe 82 adjacent to the gas supply pipe 81 form a staggered structure (arranged in a zigzag manner).

In FIG. 4B, all the ejection holes 81a, 82a, 83a, and 84a of the gas supply pipes 81, 82, 83, and 84 are provided at intermediate positions between the substrates 8.

Next, the operation of the exemplary embodiment configured as described above, that is, the substrate liquid processing method will be described. First, a phosphoric acid aqueous solution (the processing liquid) at a predetermined concentration and at a predetermined temperature is supplied to the outer bath 44 of the liquid processing unit 39 by the phosphoric acid aqueous solution supply unit 40 of the etching device 1. Next, the processing liquid from the outer bath 44 is heated by the heater 53 of the processing liquid circulating line 42 to a predetermined concentration (e.g., 87.4 wt %) and a predetermined temperature (e.g., 160° C.), and is stored in the processing bath 34 of the liquid processing unit 39. Here, the moisture is evaporated by the heating of the heater 53 to become bubbles and the bubbles rise in the processing liquid while the processing liquid is placed in a boiling state. In this case, since the concentration of the processing liquid is increased, pure water in an amount corresponding to the amount of moisture evaporated by the heating is supplied to the outer bath 44 of the liquid processing unit 39 by the pure water supply unit 41 so that the processing liquid is diluted with the pure water. Then, the substrates 8 are immersed by the substrate lift mechanism 36 in the processing bath 34 that stores the processing liquid at a predetermined concentration and a predetermined temperature so that an etching processing (liquid processing) is performed on the substrates 8 by the processing liquid. Here, the bubbles generated by evaporation of the moisture rise in the processing liquid, and the processing liquid is circulated by the rising bubbles, thereby promoting the etching processing by the processing liquid.

During the liquid processing, the phosphoric acid aqueous solution supply unit 40, the pure water supply unit 41, and the supply pump 51 and the heater 53 of the processing liquid circulating line 42 are controlled by the controller 7 to maintain the processing liquid at a predetermined concentration and a predetermined temperature.

In this case, the controller 7 drives the supply pump 51 to circulate the processing liquid through the circulation flow path 50, and drives the heater 53 to maintain the temperature of the processing liquid at a predetermined temperature so that the liquid processing of the substrates 8 is initiated.

Meanwhile, $N_2$ gas is supplied from the gas supply source to the gas supply pipes 81, 82, 83, and 84 within the processing bath 34, and the $N_2$ gas within the gas supply pipes 81, 82, 83, and 84 is supplied into the processing liquid within the processing bath 34 from the ejection holes 81a, 82a, 83a, and 84a. As described above, the gas supply pipes 81, 82, 83, and 84 are disposed below the processing liquid supply nozzles 49. The $N_2$ gas supplied from the ejection holes 81a, 82a, 83a, and 84a of the gas supply pipes 81, 82, 83, and 84 into the processing liquid forms bubbles in the processing liquid, and the bubbles composed of the $N_2$ gas form an upward flow in the processing liquid together with moisture vapor in the boiling processing liquid, so as to promote the liquid processing on the substrates 8.

The ejection holes 81a of one gas supply pipe (for example, the gas supply pipe 81) among the gas supply pipes 81, 82, 83, and 84 do not overlap the ejection holes 82a of the gas supply pipe 82 adjacent to the gas supply pipe 81 in the direction parallel to the substrates 8. Thus, the $N_2$ gas supplied from the ejection holes 81a of the gas supply pipe 81 do not coalesce with the $N_2$ gas supplied from the ejection holes 82a of the gas supply pipe 82. Thus, no variation occurs in the sizes of bubbles of the $N_2$ gas generated in the processing liquid, and the bubbles of the $N_2$ gas do not become non-uniform.

Thus, it is possible to uniformly form the bubbles of the $N_2$ gas in the processing liquid, and to perform a uniform processing on the substrates 8 by generating a stabilized rising flow in the processing liquid.

For example, in a case where it is difficult to generate an appropriate rising flow in the processing liquid within the processing bath 34 in the regions at both sides in FIG. 4A compared to the region at the central side, a large amount of $N_2$ gas may be supplied from the gas supply pipes 81 and 84 at both sides and a small amount of $N_2$ gas may be supplied from the gas supply pipes 82 and 83 at the central side by adjusting the flow rate regulating devices 81A, 82A, 83A, and 84A.

As described above, according to the present exemplary embodiment, it is possible to uniformly form the bubbles of the $N_2$ gas in the processing liquid within the processing bath 34, and to uniformly perform a liquid processing on the substrates by using the processing liquid.

In the above described exemplary embodiment, descriptions have been made for an example in which the flow rate regulating devices 81A, 82A, 83A, and 84A are used for the gas supply pipes 81, 82, 83, and 84, respectively to adjust the supply amount of the $N_2$ gas. However, in addition to this, the gas supply pipes 81, 82, 83, and 84 may be further divided into a plurality of regions A, B, and C such that the supply amount of the $N_2$ gas may be further adjusted for the regions A, B, and C of the gas supply pipes 81, 82, 83, and 84.

One flow rate regulating device 81A may be used for adjusting the supply amount of the $N_2$ gas in the two gas supply pipes 81 and 82 among the gas supply pipes 81, 82, 83, and 84, and one flow rate regulating device 83A may be used for adjusting the supply amount of the $N_2$ gas in the two gas supply pipes 83 and 84 so that the supply amount becomes different from that adjusted by the flow rate regulating device 81A.

One flow rate regulating device 82A may be used for adjusting the supply amount of the $N_2$ gas in the two gas supply pipes 82 and 83 among the gas supply pipes 81, 82, 83, and 84, and one flow rate regulating device 81A may be used for adjusting the supply amount of the $N_2$ gas in the two gas supply pipes 81 and 84 so that the supply amount becomes different from that adjusted by the flow rate regulating device 82A.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
a processing bath configured to accommodate therein a processing liquid including a phosphoric acid aqueous solution and a plurality of substrates arranged in a vertical direction, and process the substrates using the processing liquid;
a processing liquid supply pipe configured to supply the processing liquid into the processing bath; and
a plurality of gas supply pipes provided in the processing bath and configured to form bubbles by supplying a gas into the processing liquid,
wherein the gas supply pipes are provided below the substrates, and extend in a horizontal direction perpendicular to circuit-formed surfaces of the substrates, a flow direction of a gas flowing through one gas supply pipe being directed opposite to a flow direction of a gas flowing through another adjacent gas supply pipe, and
each of the gas supply pipes has a plurality of ejection holes formed directly on an outer surface of each of the gas supply pipes, ejection holes of one gas supply pipe and ejection holes of another gas supply pipe adjacent to the one gas supply pipe are arranged in a zigzag manner as viewed from a top of the processing bath, and the plurality of ejection holes are arranged to face upward in a direction parallel to the circuit-formed surfaces of the substrates.

2. The substrate liquid processing apparatus of claim 1, wherein the ejection holes are arranged to face spaces between adjacent substrates without overlapping the substrates as viewed from the top side of the processing bath.

3. The substrate liquid processing apparatus of claim 1, wherein each of the substrates is configured to be positioned between one ejection hole on one gas supply pipe and one ejection hole on another gas supply pipe adjacent to the one gas supply pipe as viewed from a top side of the processing bath.

4. The substrate liquid processing apparatus of claim 1, wherein the ejection holes are arranged along the gas supply pipes such that the bubbles are only formed in a direction parallel to the circuit-formed surfaces of the substrates.

5. The substrate liquid processing apparatus of claim 1, wherein the plurality of substrates are arranged at a predetermined arrangement pitch, and the ejection holes of the gas supply pipes are formed at an arrangement pitch corresponding to n times (n is an integer of 2 or more) the arrangement pitch of the substrates.

6. The substrate liquid processing apparatus of claim 5, wherein the ejection holes of the gas supply pipes are arranged at intermediate positions between the respective substrates.

7. The substrate liquid processing apparatus of claim 1, wherein flow rates of one gas supply pipe and another adjacent gas supply pipe are adjusted independently of each other.

8. The substrate liquid processing apparatus of claim 7, wherein the one gas supply pipe and the another adjacent gas supply pipe are divided into a plurality of regions from an upstream side to a downstream side, and a flow rate of each of the regions is independently adjusted.

9. A substrate liquid processing method performed using a substrate liquid processing apparatus that includes: a processing bath configured to accommodate therein a processing liquid including a phosphoric acid aqueous solution and a plurality of substrates arranged in a vertical direction, and process the substrates using the processing liquid; a processing liquid supply pipe configured to supply the processing liquid into the processing bath; and a plurality of gas supply pipes provided in the processing bath and configured to form bubbles by supplying a gas into the processing liquid, wherein the gas supply pipes are provided below the substrates, and extend in a horizontal direction perpendicular to circuit-formed surfaces of the substrates, a flow direction of a gas flowing through one gas supply pipe being directed opposite to a flow direction of a gas flowing through another adjacent gas supply pipe, and each of the gas supply pipes has a plurality of ejection holes formed directly on an outer surface of each of the gas supply pipes, ejection holes of one gas supply pipe and ejection holes of another gas supply pipe adjacent to the one gas supply pipe are arranged in a zigzag manner as viewed from a top of the processing bath, and the plurality of ejection holes are arranged to face upward in a direction parallel to the circuit-formed surfaces of the substrates,
wherein the substrate liquid processing method comprises:
supplying the gas into the processing liquid through the ejection holes from the one gas supply pipe and the other adjacent gas supply pipe; and
forming bubbles rising between the substrates in the processing liquid.

10. A non-transitory computer-readable storage medium storing a computer-executable program that, when executed, causes a computer to execute a substrate liquid processing method using a substrate liquid processing apparatus:
wherein the substrate liquid processing apparatus includes: a processing bath configured to accommodate therein a processing liquid including a phosphoric acid aqueous solution and a plurality of substrates arranged in a vertical direction, and process the substrates using the processing liquid; a processing liquid supply pipe configured to supply the processing liquid into the processing bath; and a plurality of gas supply pipes provided in the processing bath and configured to form bubbles by supplying a gas into the processing liquid, wherein the gas supply pipes are provided below the substrates, and extend in a horizontal direction perpendicular to circuit-formed surfaces of the substrates, a flow direction of a gas flowing through one gas supply pipe being directed opposite to a flow direction of a gas flowing through another adjacent gas supply pipe, and each of the gas supply pipes has a plurality of ejection holes formed directly on an outer surface of each of the gas supply pipes, ejection holes of one gas supply pipe and ejection holes of another gas supply pipe adjacent to the one gas supply pipe are arranged in a zigzag manner as viewed from a top of the processing bath, and the plurality of ejection holes are arranged to face upward in a direction parallel to the circuit-formed surfaces of the substrates,
wherein the substrate liquid processing method comprises:
supplying the gas into the processing liquid through the ejection holes from the one gas supply pipe and the other adjacent gas supply pipe; and
forming bubbles rising between the substrates in the processing liquid.

* * * * *